(12) United States Patent
Then et al.

(10) Patent No.: US 11,043,627 B2
(45) Date of Patent: Jun. 22, 2021

(54) TECHNIQUES FOR MONOLITHIC CO-INTEGRATION OF THIN-FILM BULK ACOUSTIC RESONATOR DEVICES AND III-N SEMICONDUCTOR TRANSISTOR DEVICES

(71) Applicant: INTEL CORPORATION, Santa Clara, CA (US)

(72) Inventors: Han Wui Then, Portland, OR (US); Sansaptak Dasgupta, Hillsborough, OR (US); Marko Radosavljevic, Portland, OR (US); Paul B. Fischer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 194 days.

(21) Appl. No.: 16/304,964

(22) PCT Filed: Jul. 1, 2016

(86) PCT No.: PCT/US2016/040769
§ 371 (c)(1),
(2) Date: Nov. 27, 2018

(87) PCT Pub. No.: WO2018/004669
PCT Pub. Date: Jan. 4, 2018

(65) Prior Publication Data
US 2020/0119255 A1    Apr. 16, 2020

(51) Int. Cl.
*H01L 41/083*  (2006.01)
*H01L 27/20*  (2006.01)
(Continued)

(52) U.S. Cl.
CPC ............ *H01L 41/083* (2013.01); *H01L 27/20* (2013.01); *H01L 29/151* (2013.01); *H01L 29/2003* (2013.01); *H03H 9/171* (2013.01)

(58) Field of Classification Search
CPC ... H01L 27/20; H01L 27/1203; H01L 29/151; H01L 29/2003; H01L 41/083; H01L 41/187; H01L 41/29
See application file for complete search history.

(56) References Cited

U.S. PATENT DOCUMENTS 5,465,171 A    11/1995  Weber et al.
5,883,575 A    3/1999   Ruby et al.
(Continued)

FOREIGN PATENT DOCUMENTS

WO    2015099692 A1    7/2015
WO    2018004669 A1    1/2018

OTHER PUBLICATIONS

International Search Report and Written Opinion recieved for PCT Application No. PCT/US2016/040769, dated Mar. 24, 2017. 13 pages.

(Continued)

*Primary Examiner* — Cuong Q Nguyen
(74) *Attorney, Agent, or Firm* — Schwabe, Williamson & Wyatt, P.C.

(57) ABSTRACT

Techniques are disclosed for co-integrating thin-film bulk acoustic resonator (TFBAR, also called FBAR) devices and III-N semiconductor transistor devices. In accordance with some embodiments, a given TFBAR device may include a superlattice structure comprising alternating layers of an epitaxial piezoelectric material, such as aluminum nitride (AlN), and any one, or combination, of other III-N semiconductor materials. For instance, aluminum indium nitride ($Al_xIn_{1-x}N$), aluminum gallium nitride ($Al_xGa_{1-x}N$), or aluminum indium gallium nitride ($Al_xIn_yGa_{1-x-y}N$) may be interleaved with the AlN, and the particular compositional ratios thereof may be adjusted to customize resonator performance. In accordance with some embodiments, the superlattice layers may be formed via an epitaxial deposition (Continued)

process, allowing for precise control over film thicknesses, in some cases in the range of a few nanometers. In accordance with some embodiments, one or more such TFBAR devices may be formed alongside III-N semiconductor transistor device(s), over a commonly shared semiconductor substrate.

20 Claims, 6 Drawing Sheets

(51) Int. Cl.
  *H01L 29/15* (2006.01)
  *H01L 29/20* (2006.01)
  *H03H 9/17* (2006.01)

(56) References Cited

U.S. PATENT DOCUMENTS

| 2007/0290230 | A1  | 12/2007 | Kawaguchi et al. |        |
|--------------|-----|---------|------------------|--------|
| 2008/0296529 | A1  | 12/2008 | Akiyama et al.   |        |
| 2015/0171823 | A1* | 6/2015  | Brawley          | H01L 27/20 |
|              |     |         |                  | 333/192 |
| 2016/0190206 | A1* | 6/2016  | Tsai             | H01L 27/20 |
|              |     |         |                  | 257/416 |

OTHER PUBLICATIONS

International Preliminary Report on Patentability recieved for PCT Application No. PCT/US2016/040769, dated Jan. 10, 2019. 10 pages.

* cited by examiner

TECHNIQUES FOR MONOLITHIC CO-INTEGRATION OF THIN-FILM BULK ACOUSTIC RESONATOR DEVICES AND III-N SEMICONDUCTOR TRANSISTOR DEVICES

CROSS-REFERENCE TO RELATED APPLICATIONS

This patent application is a U.S. National Phase Application under 35 U.S.C. § 371 of International Application No. PCT/US2016/040769, filed on Jul. 1, 2016, the entire contents of which is hereby incorporated by reference herein.

BACKGROUND

With the growing number of bands and modes of communications, the quantity of radio frequency (RF) filters utilized in modern communication systems has significantly increased. Some RF filters employ thin-film bulk acoustic resonators (TFBARs, also called FBARs). Typical RF front-end technologies employing second-generation (2G), third-generation (3G), fourth-generation (4G), and long-term evolution (LTE) wireless standards utilize multiple RF filters, each with one or more constituent TFBARs.

Figure 1:
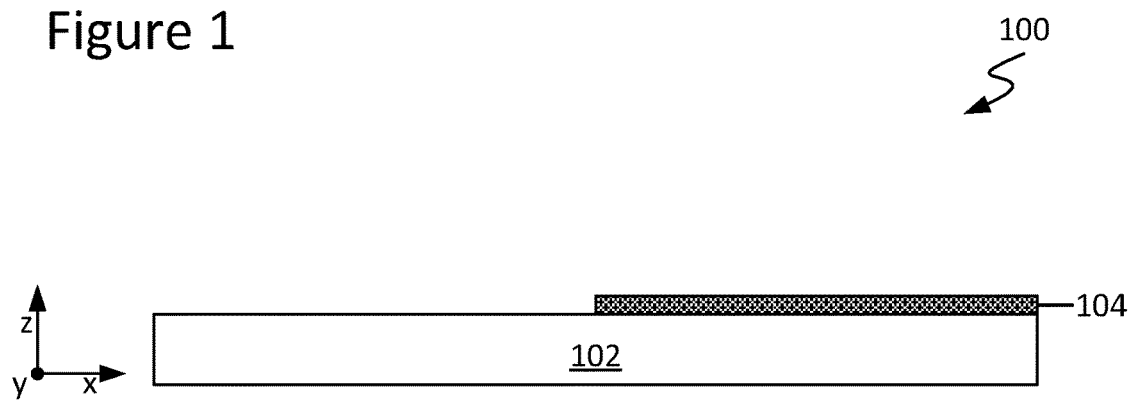
FIGS. 1-14 illustrate a process flow for forming an integrated circuit (IC) in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for co-integrating thin-film bulk acoustic resonator (TFBAR, also called FBAR) devices and III-N semiconductor transistor devices. In accordance with some embodiments, a given TFBAR device may include a superlattice structure comprising alternating layers of an epitaxial piezoelectric material, such as aluminum nitride (AlN), and any one, or combination, of other III-N semiconductor materials. For instance, in accordance with some embodiments, aluminum indium nitride ($Al_xIn_{1-x}N$), aluminum gallium nitride ($Al_xGa_{1-x}N$), or aluminum indium gallium nitride ($Al_xIn_yGa_{1-x-y}N$) may be interleaved with the AlN, and the particular compositional ratios thereof may be adjusted to customize resonator performance. In accordance with some embodiments, the superlattice layers may be formed via an epitaxial deposition process, allowing for precise control over film thicknesses, in some cases in the range of a few nanometers. In accordance with some embodiments, one or more such TFBAR devices may be formed alongside one or more III-N semiconductor transistor devices, over a commonly shared semiconductor substrate. Numerous configurations and variations will be apparent in light of this disclosure.

General Overview

The particular resonance frequency of a thin-film bulk acoustic resonator (TFBAR, also called FBAR) depends, at least in part, on the thicknesses of its constituent layers. With traditional aluminum nitride (AlN)-based TFBARs, processing constraints require the AlN material to be deposited to a given thickness by sputter deposition after back electrode processing and subsequently trimmed. However, precision control over film thickness by sputter deposition is difficult, and thus sputtered AlN is generally of poorer quality than AlN layers formed, for example, by epitaxial deposition. For instance, consider the example case of a sputtered AlN film of 2 µm thickness, which typically is characterized by X-ray diffraction (XRD) to have a full width at half maximum (FWHM) (002) of 2 degrees. In comparison, epitaxial AlN films can achieve thicknesses of about 0.5 µm or less (e.g., 0.2 µm), which are characterized by XRD to have a FWHM (002) of 0.4 degrees or less. Moreover, such film quality improvements may be obtained even in cases of epitaxial growth, for example, from a silicon (Si) substrate, which has a 41% lattice mismatch with AlN.

Thus, and in accordance with some embodiments of the present disclosure, techniques are disclosed for co-integrating thin-film bulk acoustic resonator (TFBAR, also called FBAR) devices and III-N semiconductor transistor devices. In accordance with some embodiments, a given TFBAR device may include a superlattice structure comprising alternating layers of an epitaxial piezoelectric material, such as aluminum nitride (AlN), and any one, or combination, of other III-N semiconductor materials. For instance, in accordance with some embodiments, aluminum indium nitride ($Al_xIn_{1-x}N$), aluminum gallium nitride ($Al_xGa_{1-x}N$), or aluminum indium gallium nitride ($Al_xIn_yGa_{1-x-y}N$) may be interleaved with the AlN, and the particular compositional ratios thereof may be adjusted to customize resonator performance. In accordance with some embodiments, the super-lattice layers may be formed via an epitaxial deposition process, allowing for precise control over film thicknesses, in some cases in the range of a few nanometers. In accordance with some embodiments, one or more such TFBAR devices may be formed alongside one or more III-N semiconductor transistor devices, over a commonly shared semi conductor substrate.

In accordance with some embodiments, use of the disclosed techniques may realize improvements in controlled formation of layer thicknesses to nanometer-range precision as compared to existing sputter deposition and timed etch approaches, at least in some instances. In accordance with some embodiments, use of the disclosed techniques may provide for very precise control over the thickness of the constituent epitaxial layers of a superlattice structure to produce a TFBAR of a given target resonance frequency over a semiconductor substrate (or other semiconductor layer) shared with one or more transistor devices. As will be appreciated in light of this disclosure, close proximity of a transistor device and a TFBAR resonator provided as variously described herein may allow for integration, for example, of power amplifier circuits, RF switching circuits, and RF filtering circuits on the same semiconductor substrate and thus the same die, eliminating (or otherwise reducing) losses due to extrinsic interconnection and packaging losses.

In some instances, use of techniques described herein may result in III-N semiconductor superlattice structures including higher quality piezoelectric layer(s) that provide for higher electromechanical coupling and Q-factor RF devices. As will be appreciated in light of this disclosure, these improvements, in turn, may realize bandwidth increases, reductions in signal losses, and increases in the ability of the host RF filter to reject out-of-band signals. In some cases, transistor and TFBAR devices fabricated via the disclosed techniques may be utilized in RF filters and other RF devices that may be used in communication technologies that employ any one, or combination, of second-generation (2G), third-generation (3G), fourth-generation (4G), or long-term evolution (LTE) wireless standards, among others. In some instances, use of such devices may realize lower losses and higher signal integrity, from which host wireless communication platforms may benefit.

In accordance with some embodiments, structures provided as variously described herein may be configured for use, for example, in RF front-end modules in computing devices, mobile or otherwise, and various communication systems, although numerous other applications will be apparent in light of this disclosure. In accordance with some embodiments, structures provided as variously described herein may be configured for use, for example, in base stations, cellular communication towers, and the like. In accordance with some embodiments, use of the disclosed techniques may be detected, for example, by any one, or combination, of scanning electron microscopy (SEM), transmission electron microscopy (TEM), chemical composition analysis, energy-dispersive X-ray (EDX) spectroscopy, and secondary ion mass spectrometry (SIMS) of a given IC or other semiconductor structure having a III-N semiconductor transistor and a resonator device configured as variously described herein.

Methodology and Structure

FIGS. 1-14 illustrate a process flow for forming an IC 100 in accordance with an embodiment of the present disclosure. As can be seen from FIG. 14 in particular, this process flow may be used, for example, to fabricate an IC 100 including a III-N semiconductor transistor device 101*a* and one or more resonator devices (e.g., TFBARs) 101*b* including a superlattice structure comprised of one or more piezoelectric III-N semiconductor materials, in accordance with some embodiments. It should be noted that although this process flow generally depicts and explains formation of two laterally adjacent devices 101*a* and 101*b*, the present disclosure is not intended to be so limited, as in a more general sense, and in accordance with some embodiments, the disclosed techniques may be used to form any desired quantity of III-N semiconductor transistor devices and resonator devices (having any desired target resonance frequencies) in any desired arrangement over a commonly shared semiconductor substrate. In accordance with some embodiments, the disclosed techniques may be used, for example, in forming an RF filter with a plurality of resonator devices (e.g., two or more TFBAR devices), each including a III-N semiconductor layer portion 112*b* (discussed below) that may be of a given target thickness to achieve a given target resonance frequency (or frequencies), as desired for a given target application or end-use. In some instances, multiple resonator devices, each with a different thickness and thus different resonance frequency, may be provided.

The process flow may begin as in FIG. 1, which illustrates a cross-sectional view of an IC 100 configured in accordance with an embodiment of the present disclosure. As can be seen, IC 100 may include a semiconductor substrate 102, which may have any of a wide range of configurations. For instance, semiconductor substrate 102 may be configured as any one, or combination, of a bulk semiconductor substrate, a silicon-on-insulator (SOI) structure or other semiconductor-on-insulator structure (XOI, where X represents a semiconductor material, such as silicon, germanium, germanium-enriched silicon, and so forth), a semiconductor wafer, and a multi-layered semiconductor structure. In some instances, semiconductor substrate 102 may be configured as a silicon-on-sapphire (SOS) structure.

Semiconductor substrate 102 may be comprised of any of a wide range of semiconductor materials. For instance, in some cases, semiconductor substrate 102 may be comprised of any one, or combination, of Group IV semiconductor materials, such as silicon (Si), germanium (Ge), or silicon-germanium (SiGe). In some instances, semiconductor substrate 102 may be comprised of Si having a crystallographic orientation of (111), (110), or (100), optionally with an offcut towards (110) in the range of about 1-10° (e.g., about 1-4°, about 4-7°, about 7-10°, or any other sub-range in the range of about 1-10°). In some other cases, semiconductor substrate 102 may be comprised of any one, or combination, of Group III-V compound semiconductor materials, such as gallium arsenide (GaAs) or indium phosphide (InP), among others. In some still other cases, semiconductor substrate 102 may be comprised of silicon carbide (SiC) or sapphire ($\alpha$-$Al_2O_3$). In some instances, the particular material composition of semiconductor substrate 102 may be chosen, at least in part, based on a target electrical resistivity range suitable for a given transistor device 101*a* and/or resonator device 101*b* formed there over, as described herein. In some cases, semiconductor substrate 102 may have an electrical resistivity of about 1,000 $\Omega$·cm or greater (e.g., about 1,200 $\Omega$·cm or greater, about 1,500 $\Omega$·cm or greater, and so forth).

It should be noted that semiconductor substrate 102 is not intended to be limited only to configurations and implementations as a substrate for a given host architecture, as in accordance with some other embodiments, semiconductor substrate 102 may be configured or otherwise implemented as an intermediate layer disposed in a given host architecture. Other suitable materials, configurations, and resistivity ranges for semiconductor substrate 102 will depend on a given application and will be apparent in light of this disclosure.

Also, as can be seen from FIG. 1, a dielectric layer 104 may be disposed over a topography provided, in part or in whole, by semiconductor substrate 102. Dielectric layer 104 may be comprised of any one, or combination, of a wide range of dielectric materials. For instance, in some embodiments, dielectric layer 104 may be comprised of an oxide, such as silicon dioxide ($SiO_2$) or aluminum oxide ($Al_2O_3$), a nitride, such as silicon nitride ($Si_3N_4$), or an oxynitride, such as silicon oxynitride (SiON). Dielectric layer 104 may be formed via any suitable standard, custom, or proprietary technique(s), as will be apparent in light of this disclosure. In accordance with some embodiments, dielectric layer 104 may be formed via any one, or combination, of a physical vapor deposition (PVD) process, such as sputter deposition, a chemical vapor deposition (CVD) process, such as plasma-enhanced CVD (PECVD), and an atomic layer deposition (ALD) process, to name a few. The thickness (e.g., x-thickness in the x-direction; z-thickness in the z-direction) of dielectric layer 104 may be customized, as desired for a given target application or end-use. In some cases, dielectric layer 104 may have a z-thickness in the range of about 50-500 nm (e.g., about 50-250 nm, about 250-500 nm, or any other sub-range in the range of about 50-500 nm).

In some embodiments, dielectric layer 104 may be configured to serve, at least in part, as an epitaxial lateral overgrowth (ELO) layer for a III-N semiconductor layer 106 (discussed below) of IC 100. Also, at least in some cases, dielectric layer 104 may be configured to serve as a sort of sacrificial layer utilized in the process of forming cavity 138 (discussed below). Other suitable materials, formation techniques, configurations, and dimensions for dielectric layer 104 will depend on a given application and will be apparent in light of this disclosure.

Figure 2:
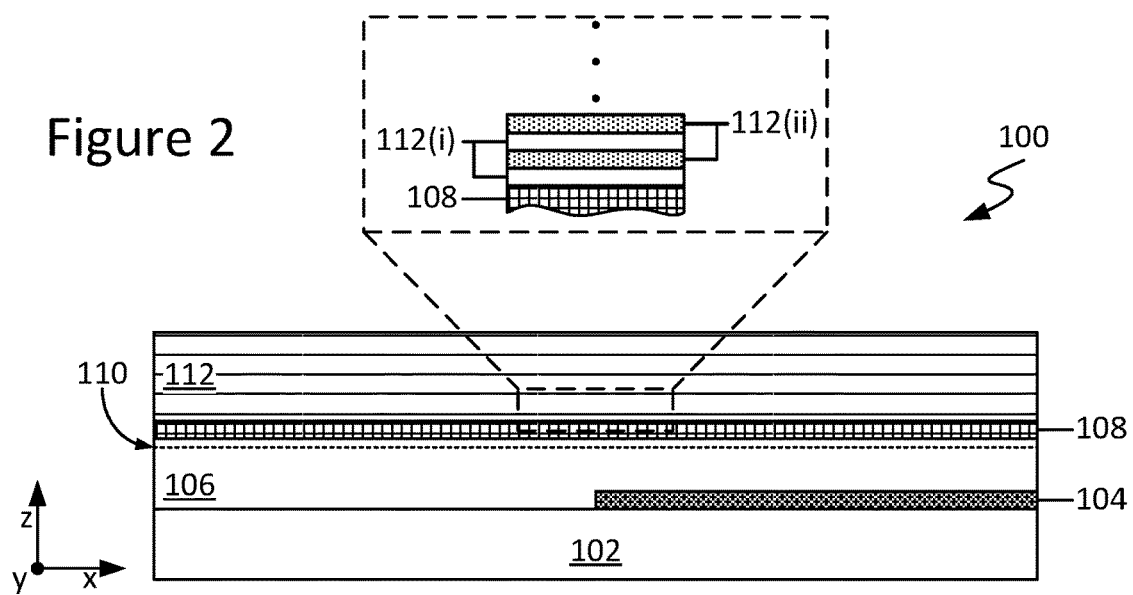

The process flow may continue as in FIG. 2, which illustrates a cross-sectional view of the IC 100 of FIG. 1 after forming a III-N semiconductor layer 106, a polarization layer 108, and a III-N semiconductor layer 112, in accordance with an embodiment of the present disclosure. III-N semiconductor layer 106 may be disposed over a topography provided, in part or in whole, by semiconductor substrate 102, dielectric layer 104, and, when included, an optional nucleation layer (discussed below). III-N semiconductor layer 106 may be comprised of any one, or combination, of III-N semiconductor materials, including gallium nitride (GaN), aluminum nitride (AlN), indium nitride (InN), indium gallium nitride (InGaN), aluminum gallium nitride (AlGaN), aluminum indium nitride (AlInN), and aluminum indium gallium nitride (AlInGaN). In some embodiments, III-N semiconductor layer 106 may be configured as a single-layer structure, whereas in some other embodiments, it may be configured as a bi-layer, tri-layer, or other multi-layer structure. In some embodiments, III-N semiconductor layer 106 may include one or more three-dimensional semiconductor structures, such as island-like semiconductor bodies or nanowire or nanoribbon semiconductor bodies, to name a few.

III-N semiconductor layer 106 may be formed via any suitable standard, custom, or proprietary technique(s), as will be apparent in light of this disclosure. For instance, in accordance with some embodiments, III-N semiconductor layer 106 may be formed via any one, or combination, of a CVD process (e.g., metal-organic chemical vapor deposition, or MOCVD) and an epitaxy process (e.g., metalorganic vapor phase epitaxy, or MOVPE; molecular beam epitaxy, or MBE), among others. In accordance with some embodiments, III-N semiconductor layer 106 may be formed, in part or in whole, via a process involving epitaxial lateral overgrowth (ELO) of the III-N material over a topography of dielectric layer 104. In accordance with some embodiments, III-N semiconductor layer 106 may be formed, in part or in whole, via a process involving a nucleation layer (discussed below).

The dimensions (e.g., z-thickness in the z-direction) of III-N semiconductor layer 106 may be customized, as desired for a given target application or end-use. In some cases, III-N semiconductor layer 106 may have a z-thickness in the range of about 3 μm or less (e.g., about 2 μm or less, about 1 μm or less, about 0.5 μm or less, or any other sub-range in the range of about 3 μm or less). In some instances, III-N semiconductor layer 106 may have a first portion (e.g., III-N semiconductor layer portion 106a, discussed below) having a z-thickness in the range of about 1-3 μm (e.g., about 1-2 μm, about 2-3 μm, or any other sub-range in the range of about 1-3 μm). In some instances, III-N semiconductor layer 106 may have a second portion (e.g., III-N semiconductor layer portion 106b, discussed below) having a z-thickness in the range of about 50-500 nm (e.g., about 50-275 nm, about 275-500 nm, or any other sub-range in the range of about 50-500 nm). Other suitable materials, formation techniques, configurations, and dimensions for III-N semiconductor layer 106 will depend on a given application and will be apparent in light of this disclosure.

As noted above, IC 100 optionally may include a nucleation layer or other suitable buffer layer, which may be disposed over a topography provided, in part or in whole, by semiconductor substrate 102 and dielectric layer 104. III-N semiconductor layer 106 may be disposed, in part or in whole, over a topography provided by such an optional nucleation layer, at least in some cases. A given optional nucleation layer may be comprised of any one, or combination, of suitable nucleation materials, such as, for example, aluminum nitride (AlN), aluminum gallium nitride (AlGaN), or an alloy of any thereof, to name a few. A given optional nucleation layer may be formed via any suitable standard, custom, or proprietary technique(s), as will be apparent in light of this disclosure. For instance, in accordance with some embodiments, a given optional nucleation layer may be formed via any one, or combination, of a molecular beam epitaxy (MBE) process and a metalorganic vapor phase epitaxy (MOVPE) process, among others. Moreover, the thickness (e.g., z-thickness in the z-direction) of a given optional nucleation layer may be customized, as desired for a given target application or end-use. In some cases, a given optional nucleation layer may have a z-thickness in the range of about 50-200 nm (e.g., about 50-125 nm, about 125-200 nm, or any other sub-range in the range of about 50-200 nm). Other suitable materials, formation techniques, configurations, and dimensions for a given optional nucleation layer will depend on a given application and will be apparent in light of this disclosure.

Also, as can be seen from FIG. 2, polarization layer 108 may be disposed over a topography provided, in part or in whole, by III-N semiconductor layer 106. Polarization layer 108 may be provided with any of the example materials and formation techniques discussed above, for instance, with respect to III-N semiconductor layer 106, in accordance with some embodiments. In some embodiments, polarization layer 108 may be comprised of $Al_xIn_{1-x}N$, where x is in the range of about 0.7-0.99. In a specific example such case, x=0.83, and thus polarization layer 108 may be an $Al_{0.83}In_{0.17}N$ layer. At x=0.83, there may be no (or otherwise negligible) lattice mismatch between polarization layer 108 and an overlying III-N semiconductor layer 112 (discussed below).

Moreover, the dimensions (e.g., z-thickness in the z-direction) of polarization layer 108 may be customized, as desired for a given target application or end-use. In some cases, polarization layer 108 may have a z-thickness in the range of about 4-100 nm (e.g., about 4-50 nm, about 50-100 nm, or any other sub-range in the range of about 10-100 nm). In accordance with some embodiments, polarization layer 108 may serve to induce a two-dimensional electron gas (2DEG) layer 110 in underlying III-N semiconductor layer 106. As discussed herein, that 2DEG layer 110 may come to serve, at least in part, as one or more electrodes for transistor device 101a and resonator device 101b of IC 100, in accordance with some embodiments. Other suitable materials, formation techniques, and dimensions for polarization layer 108 will depend on a given application and will be apparent in light of this disclosure.

As can be seen further from FIG. 2, III-N semiconductor layer 112 may be disposed over a topography provided, in part or in whole, by polarization layer 108. In accordance with some embodiments, III-N semiconductor layer 112 may be configured as a superlattice structure (e.g., bi-layer, tri-layer, or other multi-layer) including alternating layers of III-N semiconductor materials. For instance, III-N semiconductor layer 112 may include: (1) a first constituent layer 112(i) comprised of a first III-N semiconductor material; and (2) an immediately adjacent second constituent layer 112(ii) (e.g., immediately superjacent and/or immediately subjacent) comprised of a different second III-N semiconductor material. In some instances, first and second layers 112(i) and 112(ii) may be repeated in an alternating manner (e.g., as generally can be seen in the portion of FIG. 2 enclosed in the dashed box) or other given desired order. Additional third, fourth, and further constituent layers, each being comprised of a given III-N semiconductor material, optionally may be provided, in accordance with some embodiments. For consistency and ease of understanding of the present disclosure, constituent layers 112(i), 112(ii), and so forth hereinafter may be collectively referred to generally as constituent layers 112(n), except where separately referenced.

A given constituent layer 112(n) of III-N semiconductor layer 112 may be comprised of any of the example materials discussed above, for instance, with respect to III-N semiconductor layer 106, in accordance with some embodiments. In some cases, III-N semiconductor layer 112 may be a superlattice structure including alternating layers of an AlN layer 112(i) and an $Al_xIn_{1-x}N$ layer 112(ii), where x is in the range of about 0.7-0.99. In a specific example such case, x=0.9, and thus III-N semiconductor layer 112 includes alternating layers of AlN layer 112(i) and $Al_{0.9}In_{0.1}N$ layer 112(ii). In another specific example such case, x=0.83, and thus III-N semiconductor layer 112 includes alternating layers of AlN layer 112(i) and $Al_{0.83}In_{0.17}N$ layer 112(ii). At x=0.83, there may be no (or otherwise negligible) lattice mismatch between AlN layer 112(i) and $Al_{0.83}In_{0.17}N$ layer 112(ii). In some other cases, III-N semiconductor layer 112 may be a superlattice structure including alternating layers of an AlN layer 112(i) and an $Al_xGa_{1-x}N$ layer 112(ii), where x is in the range of about 0.01-0.5. In some other cases, III-N semiconductor layer 112 may be a superlattice structure including alternating layers of an AlN layer 112(i) and an $Al_xIn_yGa_{1-x-y}N$ layer 112(ii), where x is in the range of about 0.01-0.3 and y is in the range of about 0.01-0.1. In a specific example such case, x=0.9 and y=0.05, and thus III-N semiconductor layer 112 includes alternating layers of AlN layer 112(i) and $Al_{0.9}In_{0.05}Ga_{0.05}N$ layer 112(ii).

III-N semiconductor layer 112 may be formed via any suitable standard, custom, or proprietary techniques, as will be apparent in light of this disclosure. In accordance with some embodiments, a given constituent layer 112(n) of III-N semiconductor layer 112 may be formed via any one, or combination, of a CVD process, such as MOCVD, an epitaxy process, such as MBE, or an ALD process, among others. The dimensions (e.g., z-thickness in the z-direction) of a given constituent layer 112(n) of III-N semiconductor layer 112 may be customized, as desired for a given target application or end-use. In some cases, a given constituent layer 112(n) of III-N semiconductor layer 112 may have a z-thickness in the range of about 1-10 nm (e.g., about 1-2.5 nm, about 2.5-5 nm, about 7-10 nm, or any other range in the sub-range of about 1-10 nm). In some instances, III-N semiconductor layer 112 may have a z-thickness in the range of about 0.5-3 μm (e.g., about 0.5-1.75 μm, about 1.75-3 μm, or any other sub-range in the range of about 0.5-3 μm). As will be appreciated in light of this disclosure, the particular z-thickness of a given constituent layer 112(n) of III-N semiconductor layer 112 may be tuned depending on a given target resonance frequency for resonator device 101b as desired for a given target application or end-use. As will be further appreciated, precision control of such thickness may allow for very fine control in thinning a given III-N semiconductor layer 112 to provide one or multiple resonator devices (e.g., TFBARs) of different resonance frequencies over the same semiconductor substrate 102, in accordance with some embodiments. Other suitable materials, formation techniques, configurations, and dimensions for III-N semiconductor layer 112 will depend on a given application and will be apparent in light of this disclosure.

Figure 3:
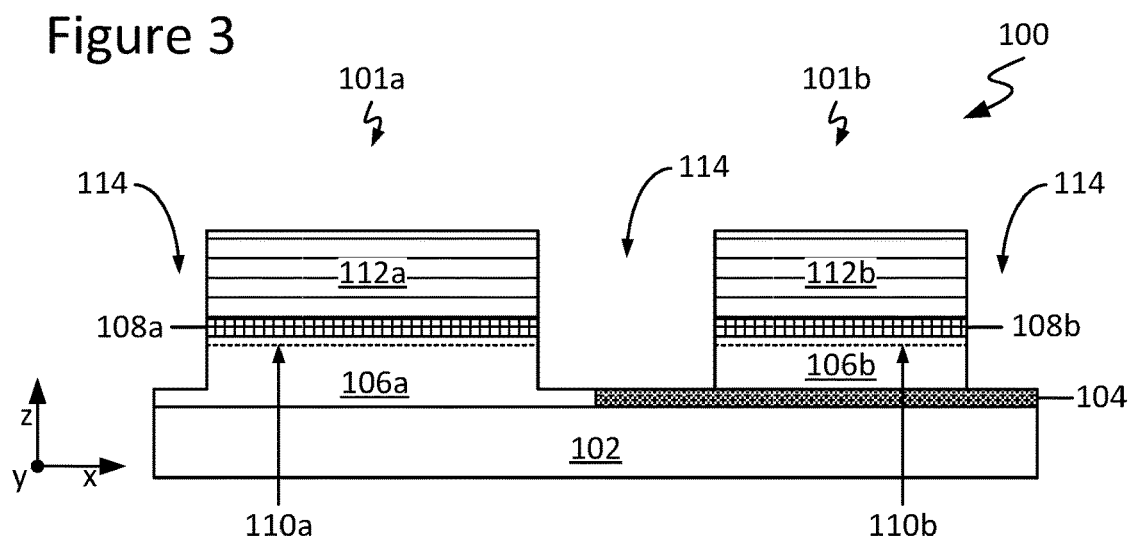

The process flow may continue as in FIG. 3, which illustrates a cross-sectional view of the IC 100 of FIG. 2 after patterning with one or more features 114, in accordance with an embodiment of the present disclosure. A given feature 114 may be, for example, a trench, via-hole, or other opening or recess that extends through a full thickness (e.g., z-thickness in the z-direction) of both III-N semiconductor layer 112 and polarization layer 108 and into III-N semiconductor layer 106. A given feature 114 may be formed via any suitable standard, custom, or proprietary lithography, etch, and clean technique(s), as will be apparent in light of this disclosure. In accordance with some embodiments, a given feature 114 may be formed via any one, or combination, of a dry etch process and a wet etch process, the etch chemistry of which may be customized, as desired for a given target application or end-use. In some cases, a dry plasma etching process utilizing a gas mixture of argon (Ar) and chlorine (Cl) may be employed.

The dimensions (e.g., x-width in the x-direction; z-depth in the z-direction) and geometry of a given feature 114 may be customized, as desired for a given target application or end-use. In some cases, a given feature 114 may have an x-width in the range of about 200-800 μm (e.g., about 200-400 μm, about 400-600 μm, about 600-800 μm, or any other sub-range in the range of about 200-800 μm). In accordance with some embodiments, a given feature 114 may have a z-depth sufficient to extend down into III-N semiconductor layer 106, landing on dielectric layer 104 (e.g., such as generally can be seen in FIG. 3). Other suitable formation techniques, configurations, and dimensions for feature(s) 114 will depend on a given application and will be apparent in light of this disclosure.

In forming feature(s) 114, separated portions of III-N semiconductor layer 112, polarization layer 108, and III-N semiconductor layer 106 may remain over separate regions of semiconductor layer 102. For instance, as can be seen generally from FIG. 3, a first stacked arrangement (e.g., a first mesa portion) including a first III-N semiconductor layer portion 106a, a first polarization layer portion 108a (which may induce a 2DEG layer 110a for transistor device 101a), and a first III-N semiconductor layer portion 112a may remain over a first portion of semiconductor substrate 102 generally corresponding to the area of formation of transistor device 101a, in accordance with some embodiments. As can be seen further, a second stacked arrangement (e.g., a second mesa portion) including a second III-N semiconductor layer portion 106b, a second polarization layer portion 108b (which may induce a 2DEG layer 110b for resonator device 101b), and a second III-N semiconductor layer portion 112b may remain over a second portion of semiconductor substrate 102 generally corresponding to the area of formation of resonator device 101b, in accordance with some embodiments. As will be appreciated in light of this disclosure, transistor device 101a may utilize 2DEG layer 110a for its channel, and resonator device 101b may utilize 2DEG layer 110b as an electrode, in accordance with some embodiments. In accordance with some embodiments, these (and other) mesa portions of IC 100 may serve as initial defining points for what ultimately may become a transistor device 101a and a resonator device 101b for IC 100 as they undergo additional processing, as described herein.

The initial dimensions of a given mesa portion of either (or both) of transistor device 101a and resonator device 101b may be customized, as desired for a given target application or end-use, and may depend, at least in part, on the dimensions of feature(s) 114 of IC 100. In some cases, either (or both) mesa portions of transistor device 101a and resonator device 101b may have an x-width in the range of about 0.1-400 µm (e.g., about 0.1-250 µm, about 250-400 µm, or any other sub-range in the range of about 50-400 µm). In some cases, either (or both) mesa portions of transistor device 101a and resonator device 101b may have a z-height in the range of about 1-3 µm (e.g., about 1-2 µm, about 2-3 µm, or any other sub-range in the range of about 1-3 µm). Other suitable configurations and dimensions will depend on a given application and will be apparent in light of this disclosure.

Figure 4:
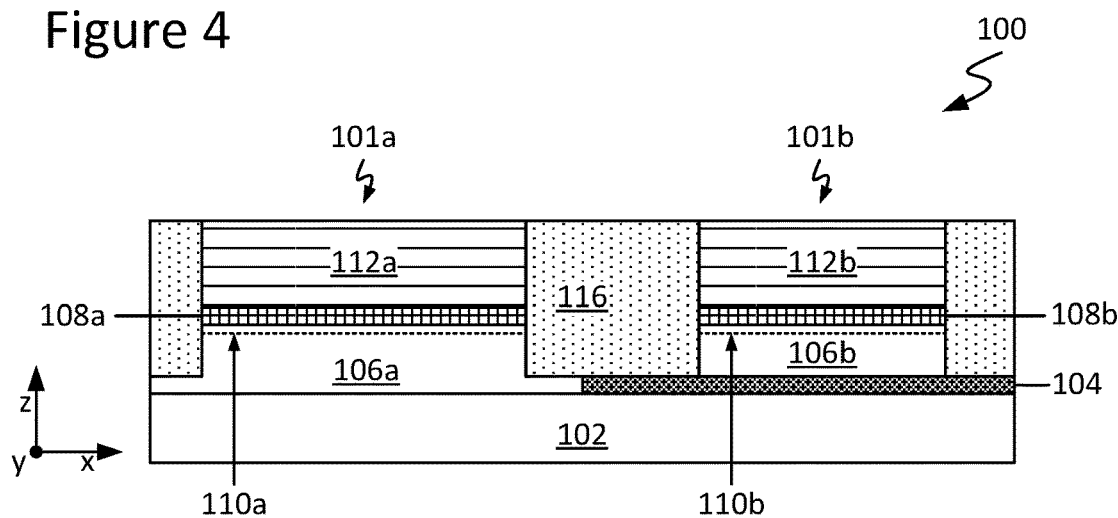

The process flow may continue as in FIG. 4, which illustrates a cross-sectional view of the IC 100 of FIG. 3 after forming a dielectric layer 116, in accordance with an embodiment of the present disclosure. Dielectric layer 116 may be disposed within a given feature 112, over a topography provided, in part or in whole, by III-N semiconductor layer portions 112a, 112b, polarization layer portions 108a, 108b, III-N semiconductor layer portions 106a, 106b, and dielectric layer 104. Dielectric layer 116 may be comprised of any one, or combination, of a wide range of dielectric materials. For instance, in some embodiments, dielectric layer 116 may be comprised of an oxide, such as silicon dioxide ($SiO_2$), aluminum oxide ($Al_2O_3$), hafnium oxide ($HfO_2$), zirconium oxide ($ZrO_2$), tantalum oxide ($Ta_2O_5$), titanium oxide ($TiO_2$), lanthanum oxide ($La_2O_3$), or carbon (C)-doped oxide (CDO), among others. In some embodiments, dielectric layer 116 may be comprised of a nitride, such as silicon mononitride (SiN) or silicon nitride ($Si_3N_4$), an oxynitride, such as silicon oxynitride (SiON) or C-doped SiON, a carbide, such as silicon carbide (SiC), or an oxycarbonitride, such as silicon oxycarbonitride (SiOCN), among others. In some embodiments, dielectric layer 116 may be comprised of an organosilicate glass (SiCOH). In some embodiments, dielectric layer 116 may be comprised of an inorganic compound, such as hydrogen silsesquioxane (HSQ).

Dielectric layer 116 may be formed via any suitable standard, custom, or proprietary technique(s), as will be apparent in light of this disclosure. In accordance with some embodiments, dielectric layer 116 may be formed via any one, or combination, of a PVD process, such as sputter deposition, a spin-on deposition (SOD) process, a CVD process, such as PECVD, and an ALD process, to name a few. The thickness (e.g., x-thickness in the x-direction; z-thickness in the z-direction) of dielectric layer 116 may be customized, as desired for a given target application or end-use. In some cases, dielectric layer 116 may have a z-thickness, for example, sufficient to at least partially fill a given feature 114. Any overburden of dielectric layer 116 may be removed, for example, via a chemical-mechanical planarization (CMP) process or other suitable planarization process. As will be appreciated in light of this disclosure, III-N semiconductor layer portions 112a, 112b may serve as a stop point in overburden removal, and thus a surface of either (or both) of III-N semiconductor layer portions 112a, 112b may be substantially co-planar with a surface of dielectric layer 116 (e.g., as generally can be seen in FIG. 4). Other suitable materials, formation techniques, configurations, and dimensions for dielectric layer 116 will depend on a given application and will be apparent in light of this disclosure.

Figure 5:
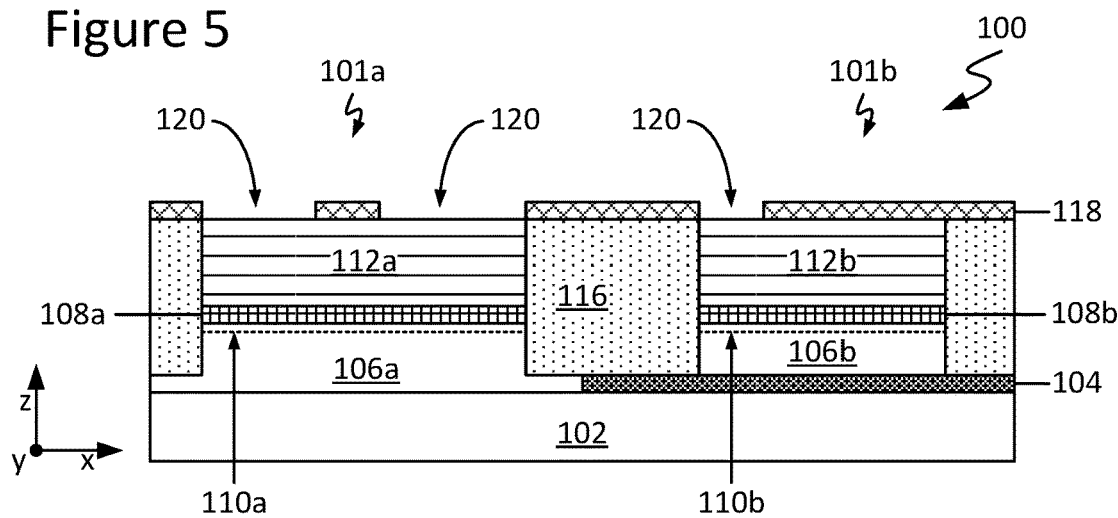

The process flow may continue as in FIG. 5, which illustrates a cross-sectional view of the IC 100 of FIG. 4 after forming a hardmask layer 118 patterned with one or more openings 120, in accordance with an embodiment of the present disclosure. Hardmask layer 118 may be disposed over a topography provided, in part or in whole, by dielectric layer 116, and III-N semiconductor layer portions 112a, 112b. Hardmask layer 118 may be comprised of any suitable hardmask material(s), as will be apparent in light of this disclosure. In some cases, hardmask layer 118 may be comprised of any one, or combination, of silicon nitride ($Si_3N_4$), silicon dioxide ($SiO_2$), and silicon oxynitride ($SiO_xN_y$), to name a few. Hardmask layer 118 may be formed via any suitable standard, custom, or proprietary technique(s), as will be apparent in light of this disclosure. In accordance with some embodiments, hardmask layer 118 may be formed via any one, or combination, of a PVD process, such as sputter deposition, and a CVD process, among others. The dimensions (e.g., z-thickness in the z-direction) of hardmask layer 118 may be customized, as desired for a given target application or end-use. In some cases, hardmask layer 118 may have a z-thickness in the range of about 100-350 nm (e.g., about 100-225 nm, about 225-350 nm, or any other sub-range in the range of about 100-350 nm). Other suitable materials, formation techniques, and dimensions for hardmask layer 118 will depend on a given application and will be apparent in light of this disclosure.

A given opening 120 of hardmask layer 118 may be, for example, a trench, via-hole, or other opening or recess that extends through a full thickness (e.g., z-thickness in the z-direction) of hardmask layer 118, exposing a surface of an underlying III-N semiconductor layer portion 112a, 112b (e.g., such as generally can be seen in FIG. 5). A given opening 120 may be formed via any of the example formation techniques discussed above, for instance, with respect to feature(s) 114, in accordance with some embodiments. In some instances, an opening 120 may be formed generally over a region of transistor device 101a in which a given source/drain (S/D) portion 124a (discussed below) is to be formed. In some instances, an opening 120 may be formed generally over a region of resonator device 101b in which a S/D portion 124b (discussed below) is to be formed. The dimensions (e.g., x-width) of a given opening 120 may be customized, as desired for a given target application or end-use, and at least in some cases may depend the particular target x-width for feature(s) 122 (discussed below). Other suitable formation techniques and configurations for opening(s) 120 will depend on a given application and will be apparent in light of this disclosure.

Figure 6:
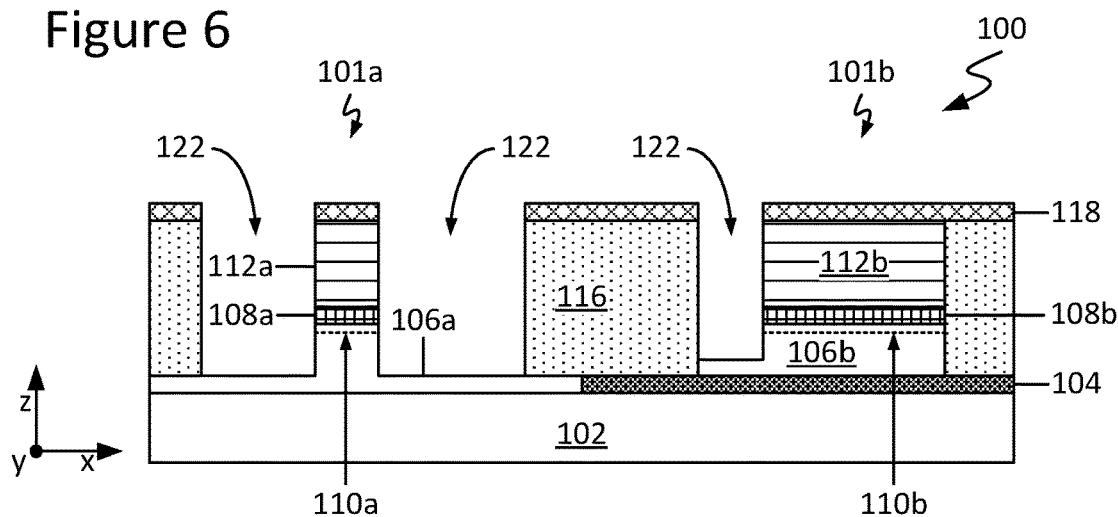

The process flow may continue as in FIG. 6, which illustrates a cross-sectional view of the IC 100 of FIG. 5 after patterning with one or more features 122, in accordance with an embodiment of the present disclosure. As can be seen, portion(s) of III-N semiconductor layer portion 112a, polarization layer portion 108a, and III-N semiconductor layer portion 106a may be removed from IC 100 by utilizing patterned hardmask layer 118 (e.g., patterned with one or more openings 120) as a mask and etching through those layers. In so doing, III-N semiconductor layer portion 106a may be partially removed to a point at which a surface thereof becomes substantially co-planar with a surface of dielectric layer 104 (e.g., such as generally can be seen in FIG. 6). Furthermore, portion(s) of III-N semiconductor layer portion 112b, polarization layer portion 108b, and III-N semiconductor layer portion 106b may be removed from IC 100 by utilizing patterned hardmask layer 118 (e.g., patterned with one or more openings 120) as a mask and etching through those layers. To these ends, any of the example formation techniques discussed above, for instance, with respect to feature(s) 114 may be utilized, in accordance with some embodiments.

The dimensions (e.g., x-width in the x-direction; z-depth in the z-direction) and geometry of a given feature 122 may be customized, as desired for a given target application or end-use. In some cases, a given feature 122 may have an x-width in the range of about 200-800 μm (e.g., about 200-400 μm, about 400-600 μm, about 600-800 μm, or any other sub-range in the range of about 200-800 μm). As will be appreciated in light of this disclosure, the z-depth of a given feature 122 may be tuned, for example, so as to extend down into III-N semiconductor layer 106 (e.g., III-N semiconductor layer portion 106a or 106b, as the case may be), in accordance with some embodiments. Other suitable formation techniques, configurations, and dimensions for feature(s) 122 will depend on a given application and will be apparent in light of this disclosure.

Figure 7:
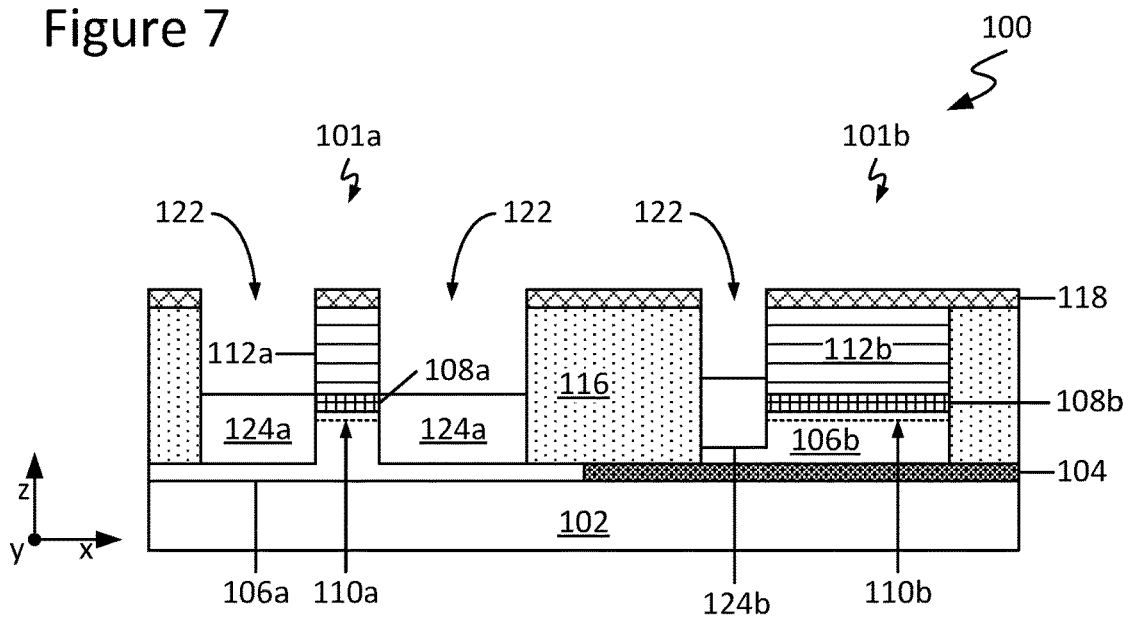

The process flow may continue as in FIG. 7, which illustrates a cross-sectional view of the IC 100 of FIG. 6 after forming S/D portions 124a for transistor device 101a and a S/D portion 124b for resonator device 101b, in accordance with an embodiment of the present disclosure. A given S/D portion 124a may be disposed within a given feature 122, over a topography provided, in part or in whole, by III-N semiconductor layer portion 106a, polarization layer portion 108a, III-N semiconductor layer portion 112a, and dielectric layer 116. A given S/D portion 124b may be disposed within a given feature 122, over a topography provided, in part or in whole, by III-N semiconductor layer portion 106b, polarization layer portion 108b, III-N semiconductor layer portion 112b, and dielectric layer 116. As can be seen generally from FIG. 7, a given S/D portion 124a may be disposed over a region of III-N semiconductor layer portion 106a, adjacent polarization layer portion 108a and 2DEG layer 110a (e.g., in a channel region of transistor device 101a).

A given S/D portion 124a, 124b may be comprised of any of a wide range of suitable S/D material(s). For instance, in accordance with some embodiments, a given S/D portion 124a, 124b may be comprised of any one, or combination, of GaN, InGaN, and InN, to name a few. In an example case, a given S/D portion 124a, 124b may be comprised of $In_5Ga_{95}N$. In another example case, a given S/D portion 124a, 124b may be comprised of $In_{15}Ga_{55}N$. In accordance with some embodiments, a given S/D portion 124a, 124b may be doped, at least in part, with an n-type dopant, such as silicon (Si) or germanium (Ge), thereby providing n-type S/D portion(s) for transistor device 101a. The particular dopant type and concentration, as well as the doping profile (e.g., dopant gradient or other variation, if any) may be customized, as desired for a given target application or end-use. In some cases, a given S/D portion 124a, 124b may be a highly n-doped (e.g., $n^+$) layer.

A given S/D portion 124a, 124b may be formed via any suitable standard, custom, or proprietary technique(s), as will be apparent in light of this disclosure. In accordance with some embodiments, a given S/D portion 124a, 124b may be formed via any one, or combination, of a CVD process (e.g., an MOCVD process) and an epitaxial process (e.g., an MBE process). Moreover, the dimensions (e.g., x-width in the x-direction; z-height in the z-direction) of a given S/D portion 124a, 124b may be customized, as desired for a given target application or end-use. In some cases, a given S/D portion 124a may have a z-height sufficient to at least partially fill a given host feature 122, for instance, to a given target height along sidewalls of any one, or combination, of III-N semiconductor layer portion 106a, polarization layer portion 108a, and III-N semiconductor layer portion 112a. In some cases, a given S/D portion 124b may have a z-height sufficient to at least partially fill a given host feature 122, for instance, to a given target height along sidewalls of any one, or combination, of III-N semiconductor layer portion 106b, polarization layer portion 108b, and III-N semiconductor layer portion 112b. In some instances, S/D portions 124a and S/D portion 124b may be substantially co-planar, whereas in other instances, different z-heights may be provided. Other suitable materials, doping schemes, formation techniques, configurations, and dimensions for a given S/D portion 124a, 124b will depend on a given application and will be apparent in light of this disclosure.

Figure 8:
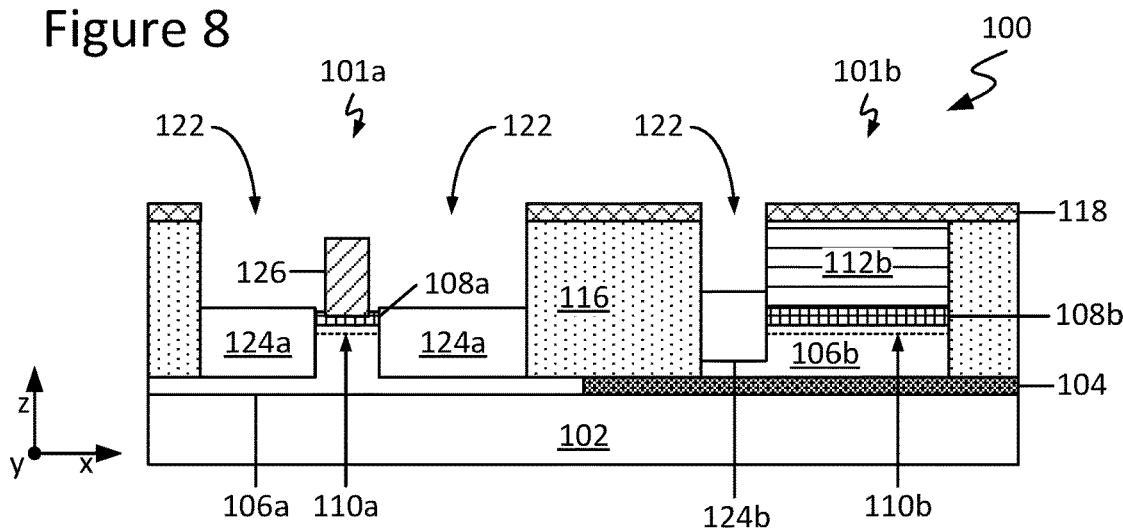

The process flow may continue as in FIG. 8, which illustrates a cross-sectional view of the IC 100 of FIG. 7 after partially removing hardmask layer 118, removing III-N semiconductor layer portion 112a, partially removing polarization layer portion 108a, and forming a gate stack layer 126 for transistor device 101a, in accordance with an embodiment of the present disclosure. Partial removal of hardmask layer 118, removal of III-N semiconductor layer portion 112a, and partial removal of polarization layer portion 108a may be provided via any of the example techniques discussed above, for instance, with respect to patterning feature(s) 114, in accordance with some embodiments. In partially removing polarization layer portion 108a, a recess (or other generally concave feature) may be formed therein, which, at least in some instances, may serve to host a gate stack layer 126.

Gate stack layer 126 may be disposed over a topography provided, in part or in whole, by polarization layer portion 108a. In accordance with some embodiments, gate stack layer 126 may include one or more gate dielectric layers and one or more gates disposed there over. In accordance with some embodiments, a given gate dielectric layer of gate stack layer 126 may be comprised of any one, or combination, of suitable dielectric materials, such as aluminum oxide ($Al_2O_3$), hafnium oxide ($HfO_2$), silicon dioxide ($SiO_2$), silicon nitride ($Si_3N_4$), and zirconium dioxide ($ZrO_2$), to name a few. In accordance with some embodiments, a given gate of gate stack layer 126 may be comprised of any one, or combination, of suitable metals or metal nitrides, such as tungsten (W), copper (Cu), aluminum (Al), titanium (Ti), titanium nitride (TiN), or an alloy of any thereof, to name a few.

Gate stack layer 126 may be formed via a CVD process or any other suitable standard, custom, or proprietary technique(s), as will be apparent in light of this disclosure. Moreover, the dimensions (e.g., x-width in the x-direction; z-thickness in the z-direction) of gate stack layer 126 may be customized, as desired for a given target application or end-use. In some cases, gate stack layer 126 (or a given constituent dielectric or gate layer thereof) may have a z-thickness in the range of about 10-500 nm (e.g., about 10-250 nm, about 250-500 nm, or any other sub-range in the range of about 10-500 nm). In a more general sense, the z-thickness of a given gate dielectric layer or gate (or both)

may be customized, as desired for a given target application or end-use. Other suitable materials, formation techniques, configurations, and dimensions for gate stack layer 126 will depend on a given application and will be apparent in light of this disclosure.

Figure 9:
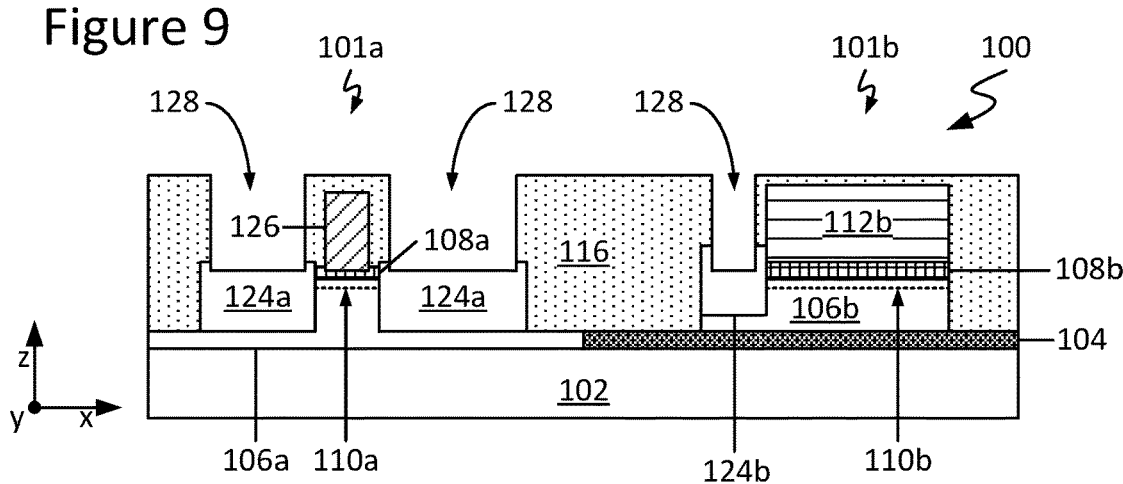

The process flow may continue as in FIG. 9, which illustrates a cross-sectional view of the IC 100 of FIG. 8 after removing hardmask layer 118, further forming dielectric layer 116, and patterning with one of more features 128, in accordance with an embodiment of the present disclosure. Removal of hardmask layer 118 may be provided via any of the example techniques discussed above, for instance, with respect to patterning feature(s) 114, in accordance with some embodiments. It should be noted, however, that removal of hardmask layer 118 at this point in the process flow is optional, as in accordance with some other embodiments, hardmask layer 118 may remain intact, in part or in whole, over resonator device 101b (e.g., as generally shown in FIG. 8). Further formation of dielectric layer 116 may be provided via any of the example techniques discussed above, for instance, with respect to forming dielectric layer 116 (e.g., in the context of FIG. 4), in accordance with some embodiments.

A given feature 128 may be provided with any of the example formation techniques and dimensions discussed above, for instance, with respect to feature(s) 114, in accordance with some embodiments. A given feature 128 may be, for example, a trench, via-hole, or other opening or recess that extends through at least a partial thickness (e.g., z-thickness in the z-direction) of dielectric layer 116 and into a given S/D portion 124a, 124b. In partially removing dielectric layer 116, a given feature 128 may land on and extend into a given S/D portion 124a, 124b, forming a recess (or other generally concave feature) therein (e.g., as generally can be seen in FIG. 9), in accordance with some embodiments. Other suitable formation techniques, configurations, and dimensions for feature(s) 128 will depend on a given application and will be apparent in light of this disclosure.

Figure 10:
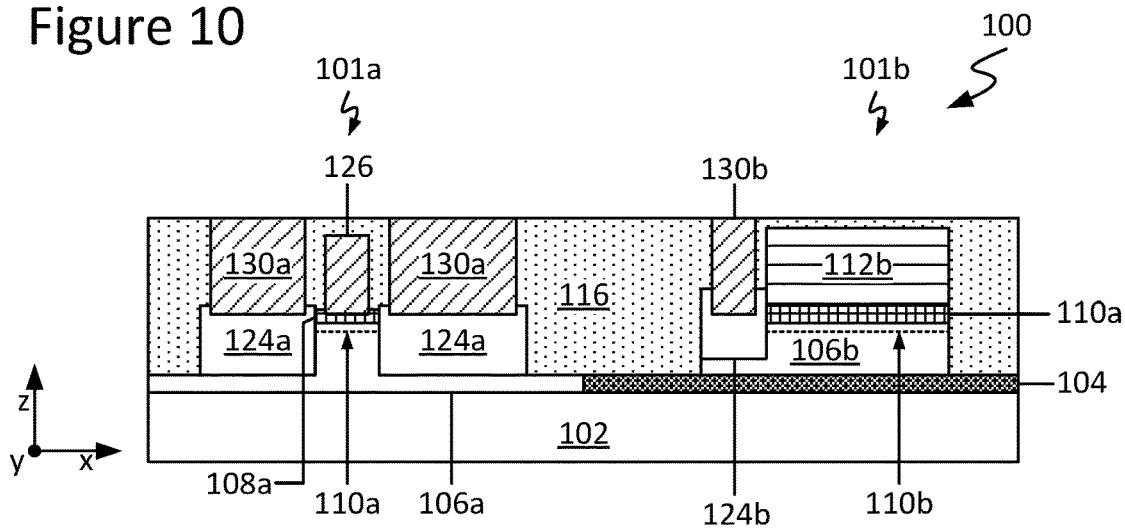

The process flow may continue as in FIG. 10, which illustrates a cross-sectional view of the IC 100 of FIG. 9 after forming S/D contacts 130a for transistor device 101a and a S/D contact 130b for resonator device 101b, in accordance with an embodiment of the present disclosure. A given S/D contact 130a may be disposed over a topography provided, in part or in whole, by a given S/D portion 124a. A given S/D contact 130b may be disposed over a topography provided, in part or in whole, by a given S/D portion 124b. A given S/D contact 130a, 130b may be comprised of any suitable electrically conductive material(s), as will be apparent in light of this disclosure. For instance, in some cases, a given S/D contact 130a, 130b may be comprised of any one, or combination, of tungsten (W), titanium (Ti), titanium nitride (TiN), or an alloy of any thereof, to name a few.

A given S/D contact 130a, 130b may be formed via any suitable standard, custom, or proprietary technique(s), as will be apparent in light of this disclosure. In accordance with some embodiments, a given S/D contact 130a, 130b may be formed via any one, or combination, of an electroplating process, an electroless deposition process, an ALD process, a PVD process, and a CVD process, among others. Any overburden of S/D contacts 130a, 130b may be removed, for example, via a CMP process or other suitable planarization process, as will be apparent in light of this disclosure.

The dimensions (e.g., x-width in the x-direction; z-height in the z-direction) of a given S/D contact 130a, 130b may be customized, as desired for a given target application or end-use, and may depend, at least in part, on the particular dimensions of a given host feature 128. In accordance with some embodiments, the dimensions of a given S/D contact 130a, 130b may be sufficient to at least partially fill a given host feature 128, making electrical contact with S/D portions 124a, 124b, as the case may be. Other suitable materials, formation techniques, and dimensions for S/D contacts 130a, 130b will depend on a given application and will be apparent in light of this disclosure.

Figure 11:
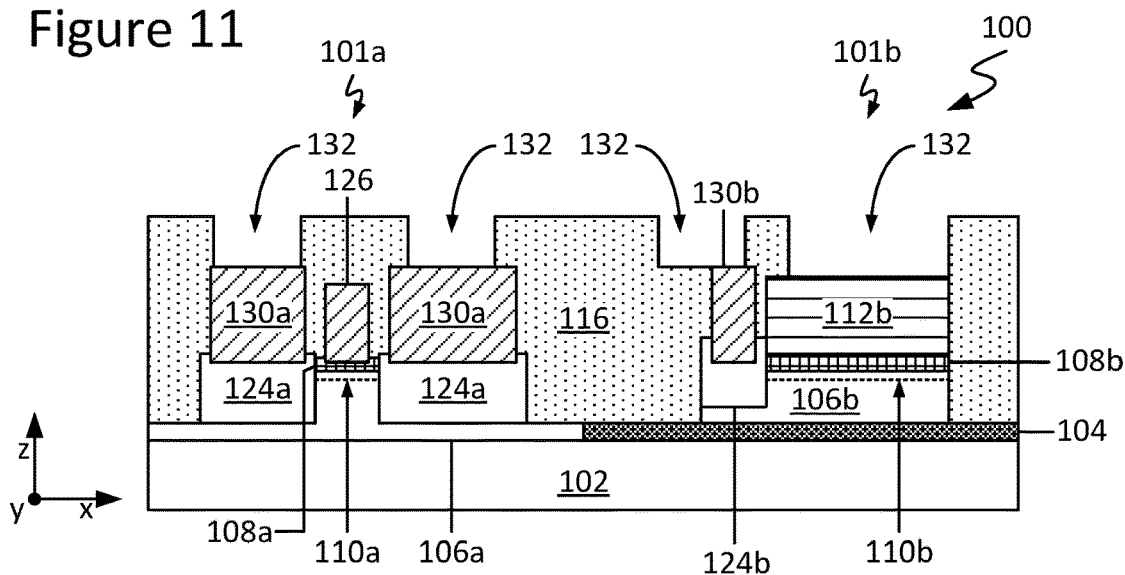

The process flow may continue as in FIG. 11, which illustrates a cross-sectional view of the IC 100 of FIG. 10 after further forming dielectric layer 116 and patterning with one of more features 132, in accordance with an embodiment of the present disclosure. Further formation of dielectric layer 116 may be provided via any of the example techniques discussed above, for instance, with respect to forming dielectric layer 116 (e.g., in the context of FIG. 4), in accordance with some embodiments. A given feature 132 may be provided with any of the example formation techniques and dimensions discussed above, for instance, with respect to feature(s) 114, in accordance with some embodiments. A given feature 132 may be, for example, a trench, via-hole, or other opening or recess that extends through at least a partial thickness (e.g., z-thickness in the z-direction) of dielectric layer 116 and lands on either a given S/D contact 130a, 130b or III-N semiconductor layer portion 112b (e.g., as generally can be seen in FIG. 11), in accordance with some embodiments. Other suitable formation techniques, configurations, and dimensions for feature(s) 132 will depend on a given application and will be apparent in light of this disclosure.

In accordance with some embodiments, III-N semiconductor layer portion 112b may be thinned down in z-thickness (e.g., to provide a resonator device 101b of a given target resonance frequency or frequencies). For instance, III-N semiconductor layer portion 112b may undergo selective removal of one or more of its constituent layers 112(n). To that end, removal of individual constituent layers 112(n) of III-N semiconductor layer portion 112b may be provided via any one, or combination, of a dry etch process and a wet etch process, the etch chemistry of which may be customized, as desired for a given target application or end-use. In accordance with some embodiments, the applied etch chemistry may be comprised of sulfur hexafluoride ($SF_6$).

As previously discussed, III-N semiconductor layer portion 112b (of original III-N semiconductor layer 112) may include, at least in some embodiments, an alternating stack of a first constituent layer 112(i) and a second constituent layer 112(ii) which differ from one another in material composition. Thus, and in accordance with some embodiments, a given constituent layer 112(n) having a first material composition may be selectively removed with no, or otherwise negligible, impact on a vertically adjacent constituent layer 112(n) having a second, different material composition. For instance, a second constituent layer 112(ii) may be removed, in part or in whole, without removing a first constituent layer 112(i) vertically adjacent thereto. Equally, a first constituent layer 112(i) may be removed, in part or in whole, without removing a second constituent layer 112(ii) vertically adjacent thereto. Selective removal on a layer-by-layer basis may be possible, at least in part, because of the different material composition (and thus etch or other removal process selectivity) of vertically adjacent constituent layers 112(n) of III-N semiconductor layer portion 112b.

As will be appreciated in light of this disclosure, further selective removal of other constituent layers 112(n) may be performed until a given target z-thickness of III-N semiconductor layer portion 112b is achieved. By selectively removing constituent layers 112(n), one at a time, from III-N semiconductor layer portion 112b, fine tuning of the resonance frequency (or frequencies, as the case may be) of resonator device 101b may be achieved, in accordance with some embodiments. In some cases, nanometer-range precision commensurate with the thickness of the individual constituent layers 112(n) may be achieved, in accordance with some embodiments.

Figure 12:
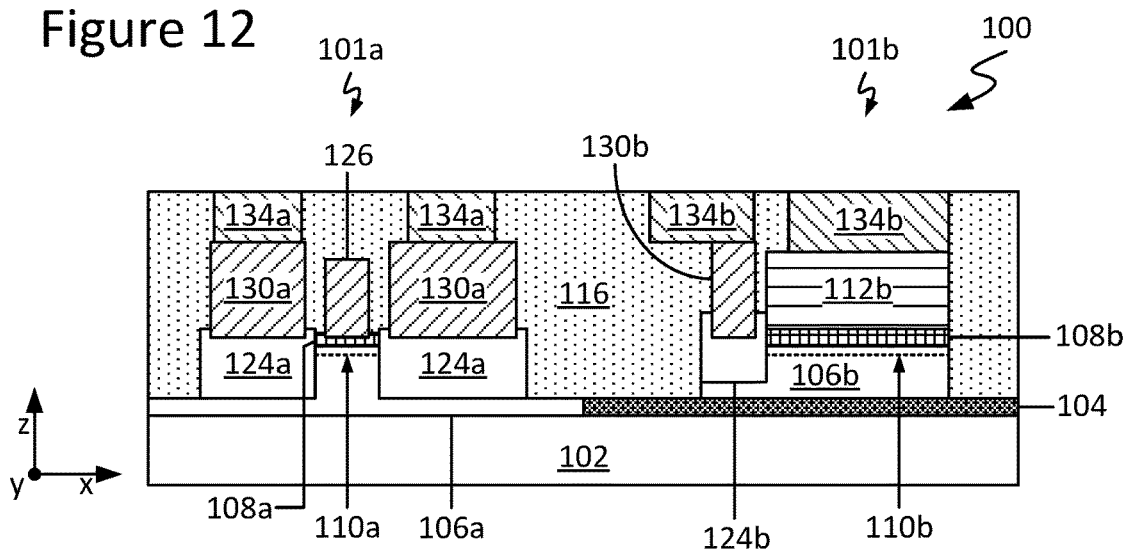

The process flow may continue as in FIG. 12, which illustrates a cross-sectional view of the IC 100 of FIG. 11 after forming electrodes 134a for transistor device 101a and electrodes 134b for resonator device 101b, in accordance with an embodiment of the present disclosure. As can be seen, electrodes 134a may be disposed within features 132 of transistor device 101a, over a topography provided, in part or in whole, by S/D contacts 130a and dielectric layer 116, making electrical contact with those S/D contacts 130a. In accordance with some embodiments, transistor device 101a may include, for example: (1) a first electrode 134a electrically contacted with a first S/D contact 130a (and thus with a first underlying S/D portion 124a); and (2) a second electrode 134a electrically contacted with a second S/D contact 130a (and thus with a second underlying S/D portion 124a). Electrodes 134b may be disposed within features 132 of resonator device 101b, over a topography provided, in part or in whole, by S/D contacts 130b and dielectric layer 116, making electrical contact with those S/D contacts 130b. In accordance with some embodiments, resonator device 101b may include, for example: (1) a first electrode 134b electrically contacted with a first S/D contact 130b (and thus with a first underlying S/D portion 124b); and (2) a second electrode 134b electrically contacted with underlying III-N semiconductor layer portion 112b.

A given electrode 134a, 134b may be comprised of any of a wide range of suitable electrically conductive materials. For instance, in some cases, electrode layer 134 may be comprised of any one, or combination, of electrically conductive refractory materials, such as tungsten (W), molybdenum (Mo), tantalum nitride (TaN), titanium nitride (TiN), or an alloy of any thereof, to name a few. A given electrode 134a, 134b may be formed via any of the example techniques discussed above, for instance, with respect to S/D contact portions 130a, 130b, in accordance with some embodiments. Moreover, the dimensions (e.g., x-width in the x-direction; z-height in the z-direction) of a given electrode 134a, 134b may be customized, as desired for a given target application or end-use, and may depend, at least in part, on the particular dimensions of a given host feature 132. In accordance with some embodiments, the dimensions of a given electrode 134a, 134b may be sufficient to at least partially fill a given host feature 132, making electrical contact with S/D contact portions 130a, 130b or III-N semiconductor layer portion 112b, as the case may be. Other suitable materials, formation techniques, and dimensions for electrodes 134a, 134b will depend on a given application and will be apparent in light of this disclosure.

Figure 13:
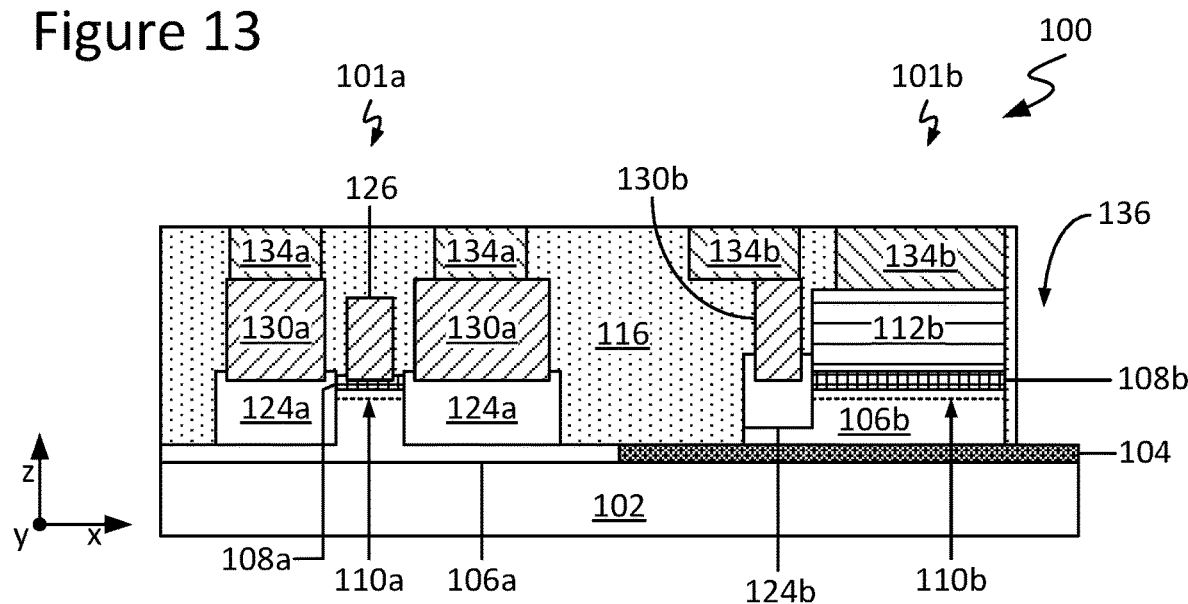

The process flow may continue as in FIG. 13, which illustrates a cross-sectional view of the IC 100 of FIG. 12 after forming a feature 136, in accordance with an embodiment of the present disclosure. Feature 136 may be, for example, a trench, via-hole, or other opening or recess that extends through a full thickness (e.g., z-thickness in the z-direction) of a portion of dielectric layer 116 (and a nucleation layer, if optionally included) to a surface of underlying dielectric layer 104. In forming feature 136, partial removal of dielectric layer 116 may be provided via any standard, custom, or proprietary lithography, etch, and clean processes, as will be apparent in light of this disclosure. In some cases, dielectric layer 104 may serve, at least in part, as a stop point in forming feature 136. Moreover, the particular dimensions of feature 136 may be customized, as desired for a given target application or end-use. Other suitable formation techniques, configurations, and dimensions for feature 136 will depend on a given application and will be apparent in light of this disclosure.

Figure 14:
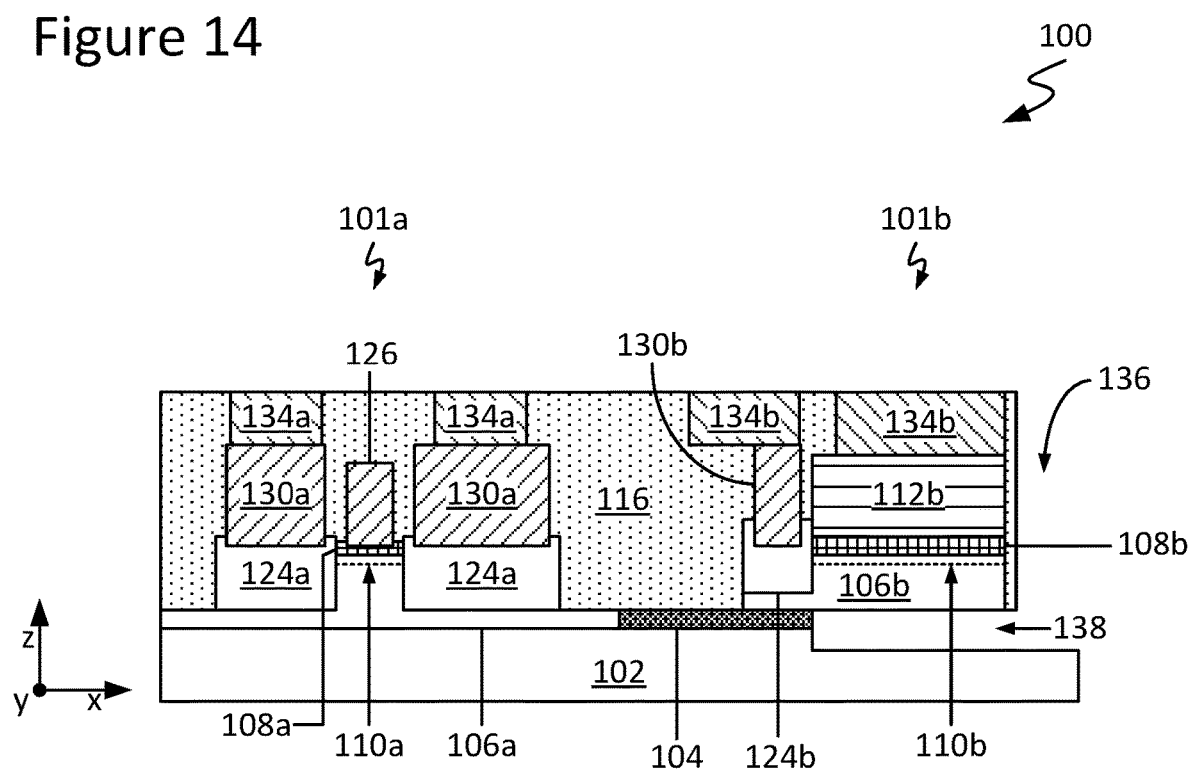

The process flow may continue as in FIG. 14, which illustrates a cross-sectional view of the IC 100 of FIG. 13 after forming a cavity 138, in accordance with an embodiment of the present disclosure. Partial removal of dielectric layer 104 and semiconductor substrate 102 to form cavity 138 may be provided via any one, or combination, of a dry etch process and a wet etch process, the etch chemistry of which may be customized, as desired for a given target application or end-use. As will be appreciated in light of this disclosure, the particular etch chemistry employed in forming cavity 138 may depend on the particular material composition of each of dielectric layer 104 and semiconductor substrate 102. Thus, for instance, if dielectric layer 104 is comprised of an oxide material, then an etchant comprised of hydrofluoric acid (HF) may be utilized in removing oxide material to form cavity 138, in accordance with some embodiments. If semiconductor substrate 102 is a Si substrate or a Si-on-insulator (SOI) of Si-on-sapphire (SOS) substrate, then an etchant comprised of potassium hydroxide (KOH) or tetra-methyl ammonium hydroxide (TMAH) (($CH_3$)$_4$NOH) may be utilized in removing Si material to form cavity 138, in accordance with some embodiments. If instead semiconductor substrate 102 is comprised of a Group III-V semiconductor material, such as GaAs or InP, for example, then an etchant comprised of phosphoric acid ($H_3PO_4$) containing hydrogen peroxide ($H_2O_2$) or comprised of a concentrated hydrochloric acid (HCl) or sulfuric acid ($H_2SO_4$) may be utilized in removing III-V material to form cavity 138, in accordance with some embodiments. Numerous other suitable etchants and etch schemes for various configurations of dielectric layer 104 and semiconductor substrate 102 will be apparent in light of this disclosure. Further note that the particular etch scheme employed may include either (or both) anisotropic and isotropic etching. In accordance with some embodiments, anisotropic etching may be utilized in forming feature 136, followed by isotropic etching to form cavity 138.

In accordance with some embodiments, the etchant(s) employed in forming cavity 138 may be delivered to dielectric layer 104 and semiconductor substrate 102 through feature 136, which may serve as a sort of passageway that channels the etchant(s) to the exposed surface and, eventually, interior of semiconductor substrate 102. In a general sense, each of dielectric layer 104 and semiconductor substrate 102 may be considered, in part or in whole, a sacrificial layer (e.g., in that at least a portion thereof may be intentionally removed from IC 100). In partially removing dielectric layer 104 and semiconductor substrate 102, cavity 138 may form under III-N semiconductor layer portion 106b of resonator device 101b, in accordance with some embodiments. As will be appreciated in light of this disclosure, the particular quantity of cavities 138 may be customized, as desired for a given target application or end-use, and at least in some instances may be made to correspond with the particular quantity of resonator devices native to IC 100. Moreover, the particular dimensions and geometry of a given cavity 138 may be customized, as desired for a given target application or end-use. In etching thereunder, resonator device 101b may extend over cavity 138 in a generally cantilevered manner over semiconductor substrate 102, in accordance with some embodiments. Also, as can be seen from FIG. 14, a portion of dielectric layer 104 may remain disposed over semiconductor substrate 102, laterally adjacent to cavity 138, in accordance with some embodiments. In some instances, this remainder portion of dielectric layer 104 may be disposed, at least in part, under III-N semiconductor layer portion 106b. One or more electrical interconnection layers optionally may be formed over IC 100 to make any desired electrical connections for either (or both) of transistor device 101a and resonator device 101b, in accordance with some embodiments.

As discussed herein, the various constituent layers of IC 100 may have any of a wide range of thicknesses (e.g., z-thicknesses in the z-direction, x-thicknesses in the x-direction, or other designated thickness), as desired for a given target application or end-use. In some instances, a given layer may be provided as a monolayer over an underlying topography. For a given IC configured as described herein, in some cases, a given constituent layer thereof may have a substantially uniform thickness over an underlying topography. In some instances, a given constituent layer may be provided as a substantially conformal layer over an underlying topography. In other instances, a given constituent layer may be provided with a non-uniform or otherwise varying thickness over an underlying topography. For example, in some cases, a first portion of a given layer may have a thickness within a first range, whereas a second portion thereof may have a thickness within a second, different range. In some instances, a given layer may have first and second portions having average thicknesses that are different from one another by about 20% or less, about 15% or less, about 10% or less, or about 5% or less. Numerous configurations and variations will be apparent in light of this disclosure.

Furthermore, as discussed herein, the various constituent layers of IC 100 may be disposed over one or more other constituent layers. In some cases, a first constituent layer may be disposed directly on a second constituent layer with no layers intervening. In some other cases, one or more intervening layers may be disposed between a first constituent layer and a second constituent layer underlying. In a more general sense, a given constituent layer may be disposed superjacent to another given constituent layer, optionally with one or more intervening layers, in accordance with some embodiments.

Example System

Figure 15:
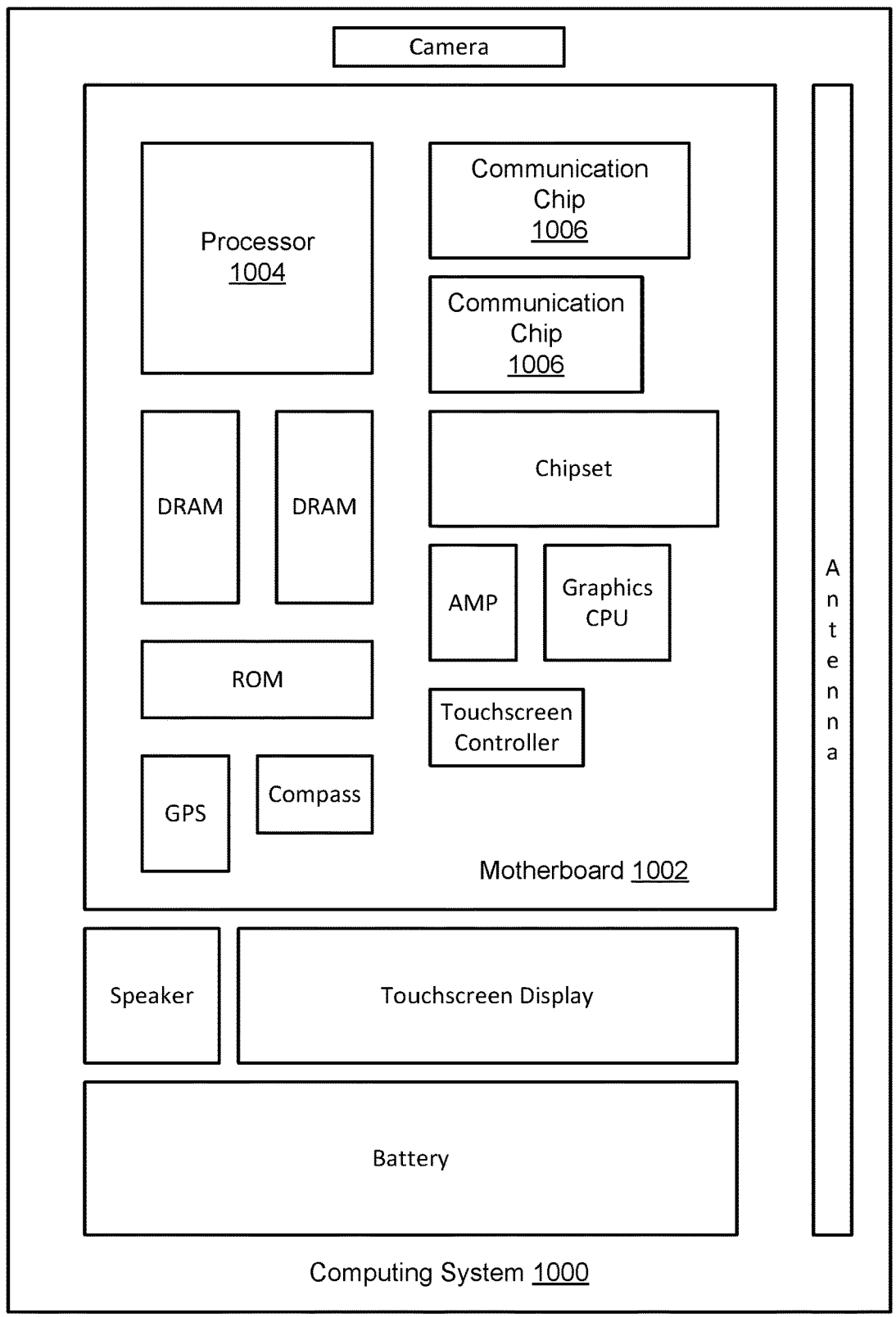
FIG. 15 illustrates a computing system implemented with IC structures or devices formed using the disclosed techniques in accordance with an example embodiment.

FIG. 15 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit including: a semiconductor substrate having a cavity formed therein; a III-N semiconductor transistor device disposed over a first portion of the semiconductor substrate; and a resonator device disposed over a second portion of the semiconductor substrate such that the cavity extends under the resonator device, the resonator device including a III-N semiconductor superlattice structure including at least one epitaxial piezoelectric layer.

Example 2 includes the subject matter of any of Examples 1, 3-4, and 8-18, wherein the III-N semiconductor superlattice structure includes: an aluminum nitride (AlN) layer; and an aluminum indium nitride ($Al_xIn_{1-x}N$) layer disposed over the AlN layer, wherein x is in the range of about 0.7-0.99.

Example 3 includes the subject matter of Example 2, wherein the $Al_xIn_{1-x}N$ layer includes $Al_{0.9}In_{0.1}N$.

Example 4 includes the subject matter of Example 2, wherein the $Al_xIn_{1-x}N$ layer includes $Al_{0.83}In_{0.17}N$.

Example 5 includes the subject matter of any of Examples 1 and 8-18, wherein the III-N semiconductor superlattice structure includes: an aluminum nitride (AlN) layer; and an aluminum gallium nitride ($Al_xGa_{1-x}N$) layer disposed over the AlN layer, wherein x is in the range of about 0.01-0.5.

Example 6 includes the subject matter of any of Examples 1 and 7-18, wherein the III-N semiconductor superlattice structure includes: an aluminum nitride (AlN) layer; and an aluminum indium gallium nitride ($Al_xIn_yGa_{1-x-y}N$) layer disposed over the AlN layer, wherein x is in the range of about 0.01-0.3 and y is in the range of about 0.01-0.1.

Example 7 includes the subject matter of Example 6, wherein the $Al_xIn_yGa_{1-x-y}N$ layer includes $Al_{0.9}In_{0.05}Ga_{0.05}N$.

Example 8 includes the subject matter of any of Examples 1-7 and 9-18, wherein the III-N semiconductor superlattice structure includes at least one III-N semiconductor layer having a z-thickness in the range of about 1-10 nm.

Example 9 includes the subject matter of any of Examples 1-8 and 10-18, wherein the resonator device further includes: a III-N semiconductor layer, wherein the III-N semiconductor superlattice structure is disposed over the III-N semiconductor layer; and a polarization layer disposed between the III-N semiconductor layer and the III-N semiconductor superlattice structure.

Example 10 includes the subject matter of Example 9, wherein the resonator device further includes: a source/drain (S/D) portion disposed over the III-N semiconductor layer; a S/D contact disposed over the S/D portion; and an electrode disposed over the S/D contact.

Example 11 includes the subject matter of Example 10, wherein the S/D portion includes at least one of gallium nitride (GaN), indium gallium nitride (InGaN), and indium nitride (InN) and is doped with at least one of silicon (Si) and germanium (Ge).

Example 12 includes the subject matter of Example 10, wherein the electrode includes at least one of tungsten (W), molybdenum (Mo), tantalum nitride (TaN), titanium nitride (TiN), and an alloy of any thereof.

Example 13 includes the subject matter of any of Examples 1-12 and 14-18, wherein the III-N semiconductor transistor device includes: a III-N semiconductor layer; a polarization layer disposed over the III-N semiconductor layer; a gate stack disposed over the polarization layer; a first source/drain (S/D) portion disposed over a first region of the III-N semiconductor layer, adjacent the polarization layer; and a second S/D portion disposed over a second region of the III-N semiconductor layer, adjacent the polarization layer.

Example 14 includes the subject matter of Example 13 and further includes: a first S/D contact disposed over the first S/D portion; and a second S/D contact disposed over the second S/D portion.

Example 15 includes the subject matter of Example 14 and further includes: a first electrode disposed over the first S/D contact; and a second electrode disposed over the second S/D contact.

Example 16 includes the subject matter of Example 13, wherein at least one of the first S/D portion and the second S/D portion includes at least one of gallium nitride (GaN), indium gallium nitride (InGaN), and indium nitride (InN) and is doped with at least one of silicon (Si) and germanium (Ge).

Example 17 includes the subject matter of any of Examples 1-16 and 18 and further includes a dielectric layer disposed over the semiconductor substrate, laterally adjacent to the cavity.

Example 18 includes the subject matter of any of Examples 1-17 and further includes a hardmask layer disposed over the III-N semiconductor superlattice structure of the resonator device.

Example 19 is a method of fabricating an integrated circuit, the method including: forming a III-N semiconductor transistor device over a first portion of a semiconductor substrate; forming a resonator device over a second portion of the semiconductor substrate, the resonator device including a III-N semiconductor superlattice structure including at least one epitaxial piezoelectric layer; and forming a cavity within the semiconductor substrate, wherein the cavity extends under the resonator device.

Example 20 includes the subject matter of any of Examples 19, 21-22, and 26-36, wherein the III-N semiconductor superlattice structure includes: an aluminum nitride (AlN) layer; and an aluminum indium nitride ($Al_xIn_{1-x}N$) layer disposed over the AlN layer, wherein x is in the range of about 0.7-0.99.

Example 21 includes the subject matter of Example 20, wherein the $Al_xIn_{1-x}N$ layer includes $Al_{0.9}In_{0.1}N$.

Example 22 includes the subject matter of Example 20, wherein the $Al_xIn_{1-x}N$ layer includes $Al_{0.83}In_{0.17}N$.

Example 23 includes the subject matter of any of Examples 19 and 26-36, wherein the III-N semiconductor superlattice structure includes: an aluminum nitride (AlN) layer; and an aluminum gallium nitride ($Al_xGa_{1-x}N$) layer disposed over the AlN layer, wherein x is in the range of about 0.01-0.5.

Example 24 includes the subject matter of any of Examples 19 and 25-36, wherein the III-N semiconductor superlattice structure includes: an aluminum nitride (AlN) layer; and an aluminum indium gallium nitride ($Al_xIn_y$ $Ga_{1-x-y}N$) layer disposed over the AlN layer, wherein x is in the range of about 0.01-0.3 and y is in the range of about 0.01-0.1.

Example 25 includes the subject matter of Example 24, wherein the $Al_xIn_yGa_{1-x-y}N$ layer includes $Al_{0.9}In_{0.05}Ga_{0.05}N$.

Example 26 includes the subject matter of any of Examples 19-25 and 27-36, wherein the III-N semiconductor superlattice structure includes at least one III-N semiconductor layer having a z-thickness in the range of about 1-10 nm.

Example 27 includes the subject matter of any of Examples 19-26 and 28-36, wherein forming the resonator device includes: forming a III-N semiconductor layer, wherein the III-N semiconductor superlattice structure is disposed over the III-N semiconductor layer; and forming a polarization layer, wherein the polarization layer is disposed between the III-N semiconductor layer and the III-N semiconductor superlattice structure.

Example 28 includes the subject matter of Example 27, wherein forming the resonator device further includes: forming a source/drain (S/D) portion over the III-N semiconductor layer; forming a S/D contact over the S/D portion; and forming an electrode over the S/D contact.

Example 29 includes the subject matter of Example 28, wherein the S/D portion includes at least one of gallium nitride (GaN), indium gallium nitride (InGaN), and indium nitride (InN) and is doped with at least one of silicon (Si) and germanium (Ge).

Example 30 includes the subject matter of Example 28, wherein the electrode includes at least one of tungsten (W), molybdenum (Mo), tantalum nitride (TaN), titanium nitride (TiN), and an alloy of any thereof.

Example 31 includes the subject matter of any of Examples 19-30 and 32-36, wherein forming the III-N semiconductor transistor device includes: forming a III-N semiconductor layer; forming a polarization layer over the III-N semiconductor layer; forming a gate stack over the polarization layer; forming a first source/drain (S/D) portion over a first region of the III-N semiconductor layer, adjacent the polarization layer; and forming a second S/D portion over a second region of the III-N semiconductor layer, adjacent the polarization layer.

Example 32 includes the subject matter of Example 31, wherein forming the III-N semiconductor transistor device further includes: forming a first S/D contact over the first S/D portion; and forming a second S/D contact over the second S/D portion.

Example 33 includes the subject matter of Example 32, wherein forming the III-N semiconductor transistor device further includes: forming a first electrode over the first S/D contact; and forming a second electrode over the second S/D contact.

Example 34 includes the subject matter of Example 31, wherein at least one of the first S/D portion and the second S/D portion includes at least one of gallium nitride (GaN), indium gallium nitride (InGaN), and indium nitride (InN) and is doped with at least one of silicon (Si) and germanium (Ge).

Example 35 includes the subject matter of any of Examples 19-34 and 36 and further includes forming a dielectric layer over the semiconductor substrate, laterally adjacent to the cavity.

Example 36 includes the subject matter of any of Examples 19-35 and further includes forming a hardmask layer over the III-N semiconductor superlattice structure of the resonator device.

Example 37 is an integrated circuit including: a semiconductor substrate; a gallium nitride (GaN) transistor device disposed over a first portion of the semiconductor substrate; and a thin-film bulk acoustic resonator (TFBAR) device disposed over a second portion of the semiconductor substrate and including a III-N semiconductor superlattice structure including alternating layers of epitaxial aluminum nitride (AlN) and at least one other III-N semiconductor layer.

Example 38 includes the subject matter of any of Examples 37 and 39-43, wherein the GaN transistor device includes: a GaN layer; a polarization layer disposed over the GaN layer; a gate stack disposed over the polarization layer; a first n-type source/drain (S/D) portion disposed over a first region of the GaN layer, adjacent the polarization layer; and a second n-type S/D portion disposed over a second region of the GaN layer, adjacent the polarization layer.

Example 39 includes the subject matter of any of Examples 37-38 and 40-43, wherein the TFBAR device further includes: a GaN layer disposed under the III-N semiconductor superlattice structure; a polarization layer disposed between the GaN layer and the III-N semiconductor superlattice structure; and an electrode disposed over the III-N semiconductor superlattice structure.

Example 40 includes the subject matter of any of Examples 37-39 and 42-43, wherein the semiconductor substrate includes a Group IV semiconductor material.

Example 41 includes the subject matter of any of Examples 37-39 and 42-43, wherein the semiconductor substrate includes a Group III-V compound semiconductor material.

Example 42 includes a radio frequency (RF) filter including an integrated circuit including the subject matter of any of Examples 37-41 and 43.

Example 43 includes a mobile computing device including the RF filter including the subject matter of Example 42.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
   a substrate having a cavity formed therein;
   a transistor device over a first portion of the substrate and comprising a first III-N semiconductor material; and
   a resonator device over a second portion of the substrate such that the cavity extends under the resonator device, the resonator device comprising a superlattice structure comprising first and second layers, the first layer comprising a second III-N semiconductor material, and the second layer comprising a third III-N semiconductor material.

2. The integrated circuit of claim 1, wherein the superlattice structure comprises:
   an aluminum nitride (AlN) layer for one of the first and second layers; and
   an aluminum indium nitride ($Al_xIn_{1-x}N$) layer over the AlN layer, wherein x is in the range of 0.7-0.99, for the other of the first and second layers.

3. The integrated circuit of claim 2, wherein the $Al_xIn_{1-x}N$ layer comprises $Al_{0.9}In_{0.1}N$.

4. The integrated circuit of claim 2, wherein the $Al_xIn_{1-x}N$ layer comprises $Al_{0.83}In_{0.17}N$.

5. The integrated circuit of claim 1, wherein the superlattice structure comprises:
an aluminum nitride (AlN) layer for one of the first and second layers; and
an aluminum gallium nitride ($Al_xGa_{1-x}N$) layer over the AlN layer, wherein x is in the range of 0.01-0.5, for the other of the first and second layers.

6. The integrated circuit of claim 1, wherein the III-N semiconductor superlattice structure comprises:
an aluminum nitride (AlN) layer for one of the first and second layers; and
an aluminum indium gallium nitride ($Al_xIn_yGa_{1-x-y}N$) layer over the AlN layer, wherein x is in the range of 0.01-0.3 and y is in the range of 0.01-0.1, for the other of the first and second layers.

7. The integrated circuit of claim 6, wherein the $Al_xIn_yGa_{1-x-y}N$ layer comprises $Al_{0.9}In_{0.05}Ga_{0.05}N$.

8. The integrated circuit of claim 1, wherein one or both of the second and third III-N semiconductor material layers has a z-thickness in the range of 1-10 nm.

9. The integrated circuit of claim 1, wherein the resonator device further comprises:
a fourth layer comprising a III-N semiconductor material, wherein the superlattice structure is over the fourth layer; and
a fifth layer between the fourth layer and the superlattice structure.

10. The integrated circuit of claim 9, wherein the resonator device further comprises:
a source or drain portion over the fourth layer;
a contact over the source or drain portion; and
an electrode over the contact.

11. The integrated circuit of claim 10, wherein at least one of:
the source or drain portion comprises nitrogen (N) and one or both of gallium (Ga) and indium (In), and is doped with at least one of silicon (Si) and germanium (Ge); and
the electrode comprises at least one of tungsten (W), molybdenum (Mo), tantalum nitride (TaN), titanium nitride (TiN), and an alloy of any thereof.

12. The integrated circuit of claim 1 further comprising a dielectric layer over the substrate, laterally adjacent to the cavity.

13. The integrated circuit of claim 1 further comprising a hardmask layer over the superlattice structure.

14. An integrated circuit comprising:
a substrate;
a transistor device over a first portion of the substrate and comprising gallium (Ga) and nitrogen (N); and
an acoustic resonator device over a second portion of the substrate and comprising a superlattice structure comprising a first layer of aluminum nitride (AlN) and a second layer comprising aluminum, nitrogen, and one or both of gallium and indium.

15. The integrated circuit of claim 14, wherein the substrate comprises a Group IV semiconductor material.

16. The integrated circuit of claim 14, wherein the substrate comprises a Group III-V compound semiconductor material.

17. A radio frequency (RF) filter circuit comprising the integrated circuit of claim 14.

18. A mobile computing device comprising the RF filter circuit of claim 17.

19. An integrated circuit comprising:
a substrate having a cavity formed therein;
a transistor device over a first portion of the substrate, the transistor device comprising (i) a first III-N semiconductor material, and (ii) a first layer comprising at least one of gallium, aluminum, or indium, the first layer under the first III-N semiconductor material; and
a resonator device over a second portion of the substrate, the resonator device comprising (i) a second III-N semiconductor material, and (ii) a second layer comprising at least one of gallium, aluminum, or indium, the second layer under the second III-N semiconductor material and above the cavity,
wherein a first two-dimensional electron gas (2DEG) configuration is inducible within the first layer,
wherein a second two-dimensional electron gas (2DEG) configuration is inducible within the second layer, and
wherein a bottom surface of the first III-N semiconductor material and a bottom surface of the second III-N semiconductor material are coplanar.

20. The integrated circuit of claim 14, further comprising:
a structure comprising alternating layers of a third III-N semiconductor material and fourth III-N semiconductor material, the structure above and in direct contact with the second III-N semiconductor material.

* * * * *